(12) United States Patent
Auracher

(10) Patent No.: US 6,341,094 B1
(45) Date of Patent: Jan. 22, 2002

(54) METHOD AND APPARATUS FOR FUNCTIONAL TESTING OF MEMORY RELATED CIRCUITS

(75) Inventor: Stefan Auracher, Baierbrunn (DE)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/918,387

(22) Filed: Jul. 30, 2001

(51) Int. Cl.[7] .............................................. G11C 29/00
(52) U.S. Cl. .................................... 365/201; 365/189.07
(58) Field of Search ............................. 365/201, 189.07

(56) References Cited

U.S. PATENT DOCUMENTS

| | | | | |
|---|---|---|---|---|
| 4,249,250 A | * | 2/1981 | Scowen et al. | 365/189.07 |
| 4,584,663 A | * | 4/1986 | Tanikawa et al. | 714/49 |
| 4,718,042 A | * | 1/1988 | Moll et al. | 365/201 |

* cited by examiner

Primary Examiner—Andrew Q. Tran
(74) Attorney, Agent, or Firm—Christopher P. Maiorana

(57) ABSTRACT

An apparatus for testing a functional operation of a memory related circuit. The memory related circuit may be represented by a first circuit model defining a circuit under test. The apparatus may comprise a storage device and a processor. The storage device may be configured for storing the first circuit model representing the circuit under test, and for storing a second circuit model. The second circuit model may represent a testbench circuit for interfacing with the circuit under test, and may include a first memory and monitor circuitry. The first memory may be configured for interfacing with a first port of the circuit under test. The monitor circuitry may be configured for interfacing with the at least one of said memory and a second port of the circuit under test, for monitoring the response of the circuit under test as simulated signals are applied thereto. The processor may be configured for processing the first and second circuit models to simulate the response of the circuit under test when the simulated signals are applied thereto via the testbench circuit. The simulated signals may simulate read and write accesses to the circuit under test.

18 Claims, 4 Drawing Sheets

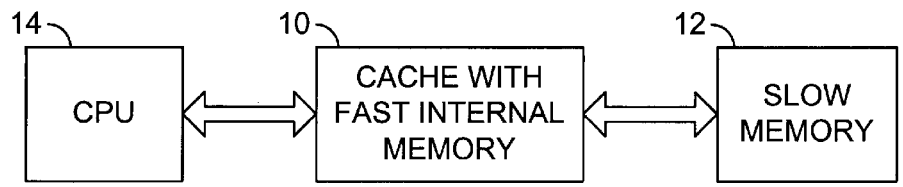
FIG. 1
(CONVENTIONAL)
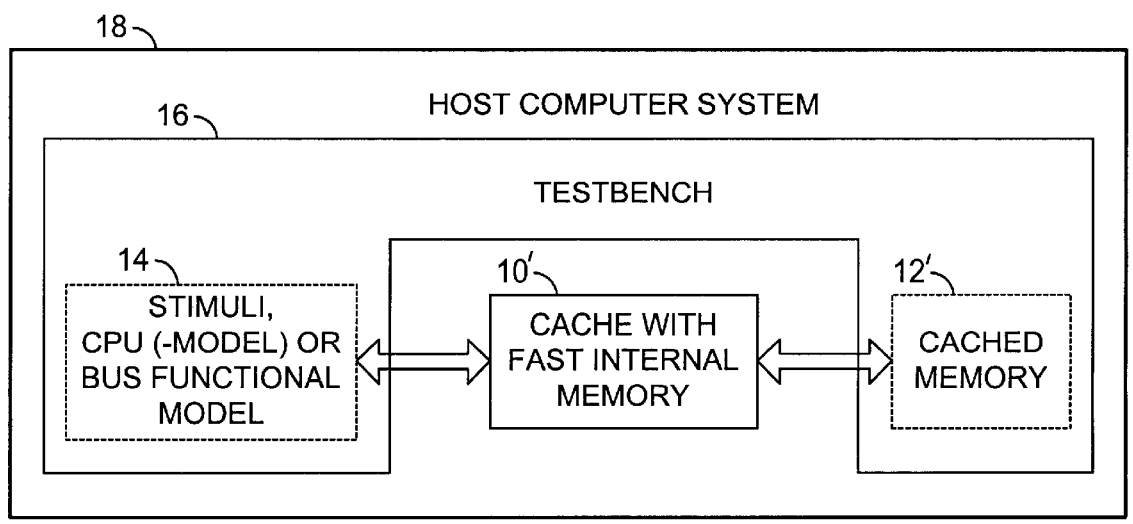
FIG. 2
(CONVENTIONAL)

METHOD AND APPARATUS FOR FUNCTIONAL TESTING OF MEMORY RELATED CIRCUITS

FIELD OF THE INVENTION

The present invention relates to a method and apparatus for functional testing of memory related circuits. Such circuits include, for example, caches, memory controllers, memory management units (MMU's), and write-buffers. The invention is especially suitable for testing such circuits at the circuit design level, i.e. prior to the circuit being fabricated in an integrated circuit.

BACKGROUND TO THE INVENTION

At the design stage for an integrated circuit, a circuit design is typically represented as circuit data in a hardware description language (HDL). From the HDL, the circuit design can be mapped (through suitable processing) into an actual hardware design for fabrication in an integrated circuit. IEEE standards exist for HDLs, such as Verilog (IEEE standard 1364) and VHDL (IEEE standard 1076–1993).

The testing of circuit designs prior to fabrication in an integrated circuit is referred to in the art as verification, and represents an important step in the design process for an integrated circuit. With the complexity of circuits increasing continuously, it is impossible to guarantee the proper operation of a design without undergoing an extensive prior verification of the design.

One part of verification is functional verification, which focuses on testing whether a design behaves as it is supposed to from a functional point of view. In digital designs, this is usually done by testing the HDL model in a virtual testbench environment using a computer. This principle of functional verification using its data model is well known to the skilled man. FIG. 1 illustrates a typical circuit arrangement for a cache circuit 10, and FIG. 2 illustrates a conventional virtual testbench for functional verification of the design of the cache using its design (HDL) model 10'. As is known the skilled man, a cache 10 comprises a small fast memory with additional control logic, and is used to reduce the effective access time of a slower memory 12 addressed by a microprocessor (CPU) 14. The cache 10 is typically coupled between the slower memory (or memory to be cached, also referred to herein as the "cached memory") 12 and the CPU 14, and the memory within the cache 10 stores portions of the data stored also in the slower memory 12, ideally the most frequently accessed data. When the CPU addresses data that is currently held in the cache 10, this is referred to as a cache-hit. In such a case, the cache 10 services the access and suppresses the access to the slower memory 12. As the cache 10 can handle the access faster than the slower memory 12, the CPU saves wait-states whenever a cache-hit occurs, leading to higher system performance.

Referring to FIG. 2, the virtual testbench environment 16 is defined in a host computer apparatus 18. In the virtual testbench environment, at least the cache 10' and the slow memory 12' are represented by HDL data. Patterns of virtual test signals are applied to the cache model 10' to simulate read and write accesses, and the reactions of the cache model 10' are recorded. By analysing the behaviour of the cache model 10', and analysing the data in the cache and in the memory, the functionality of the cache can be verified.

The model may describe the circuit at various levels of detail or abstraction. A more abstract model may define the merely the behaviour of the circuit as a whole, rather than of part of the circuit. A more detailed model may describe the functionality of parts of the circuit and the dataflow in the circuit, and may be partly or wholly synthesisable in hardware. However, the more detailed the model, the slower it is to test. Therefore, tests are normally carried out progressively, starting with the fast (abstract) model, and progressing through other models if each functional verification passes its tests.

In one form, the cache model 10' is driven either by hard-coded stimuli, or by a bus functional model which can simulate different bus accesses to the cache. After simulation, the developer has to analyse the cache behaviour and the memory contents manually, which is laborious and very time-consuming.

In another form, the CPU 14 is incorporated in the testbench as a model represented by HDL data. The person developing the circuit can then write code which is "executed" on the CPU-model and tests the cache model 10'. Although the code "running" on the CPU-model can help to identify incorrect operation of the cache model 10' to a certain extent, it cannot identify an exact time of occurrence of a cache error in view of the program execution overhead. In other words, the software cannot monitor immediately each access which it creates. Hence there is a variable time delay from the point in time when an error occurs, and the point in time at which this can be detected by software on the same CPU 14. In addition, such a semi-automatic method of analysis slows the simulation significantly.

A further aspect which slows verification for both of the above techniques is the required loading and unloading of data to and from the cached memory model 12'. Before the verification process can begin, the memory model 12' has to be loaded with predetermined data, so that the memory model 12' has a desired known state before the test. Also, the complete contents of the memory model 12' have to be unloaded for analysis after the test, so that the operation of the cache model 10' can be fully verified. Such loading and unloading of data has to be performed through the cache model 10' with the cache held in a de-activated state. Each data transfer operation is time consuming, and the need for two transfers (one for loading, one for unloading) slows the verification process considerably.

SUMMARY OF THE INVENTION

The invention concerns an apparatus for testing a functional operation of a memory related circuit. The memory related circuit may be represented by a first circuit model defining a circuit under test. The apparatus may comprise a storage device and a processor. The storage device may be configured for storing the first circuit model representing the circuit under test, and for storing a second circuit model. The second circuit model may represent a testbench circuit for interfacing with the circuit under test, and may include a first memory and monitor circuitry. The first memory may be configured for interfacing with a first port of the circuit under test. The monitor circuitry may be configured for interfacing with at least one of the memory and a second port of the circuit under test, for monitoring the response of the circuit under test as simulated signals are applied thereto. The processor may be configured for processing the first and second circuit models to simulate the response of the circuit under test when the simulated signals are applied thereto via the testbench circuit. The simulated signals may simulate read and write accesses to the circuit under test.

The objects, features and advantages of the invention include providing an arrangement which can verify the functionality of the circuit under test (i) in near real time, simultaneously with the stimulation of the circuit under test, (ii) without requiring software overhead for a stimulator CPU model, (iii) automatically without requiring unloading of a memory merely to verify the functionality, and (iv) optionally with a similar reference model to provide a direct comparison of expected internal circuit behaviour and expected internal signals.

DESCRIPTION OF THE DRAWINGS

These and other objects, features and advantages of the present invention will be apparent from the following detailed description and the appended claims and drawings, in which:

FIG. 1 is a schematic block diagram showing a cache coupled conventionally between a slow memory and a CPU;

FIG. 2 is a schematic block diagram showing a conventional testbench for functionally verifying an HDL model of the cache;

DESCRIPTION OF PREFERRED EMBODIMENTS

Figure 3:
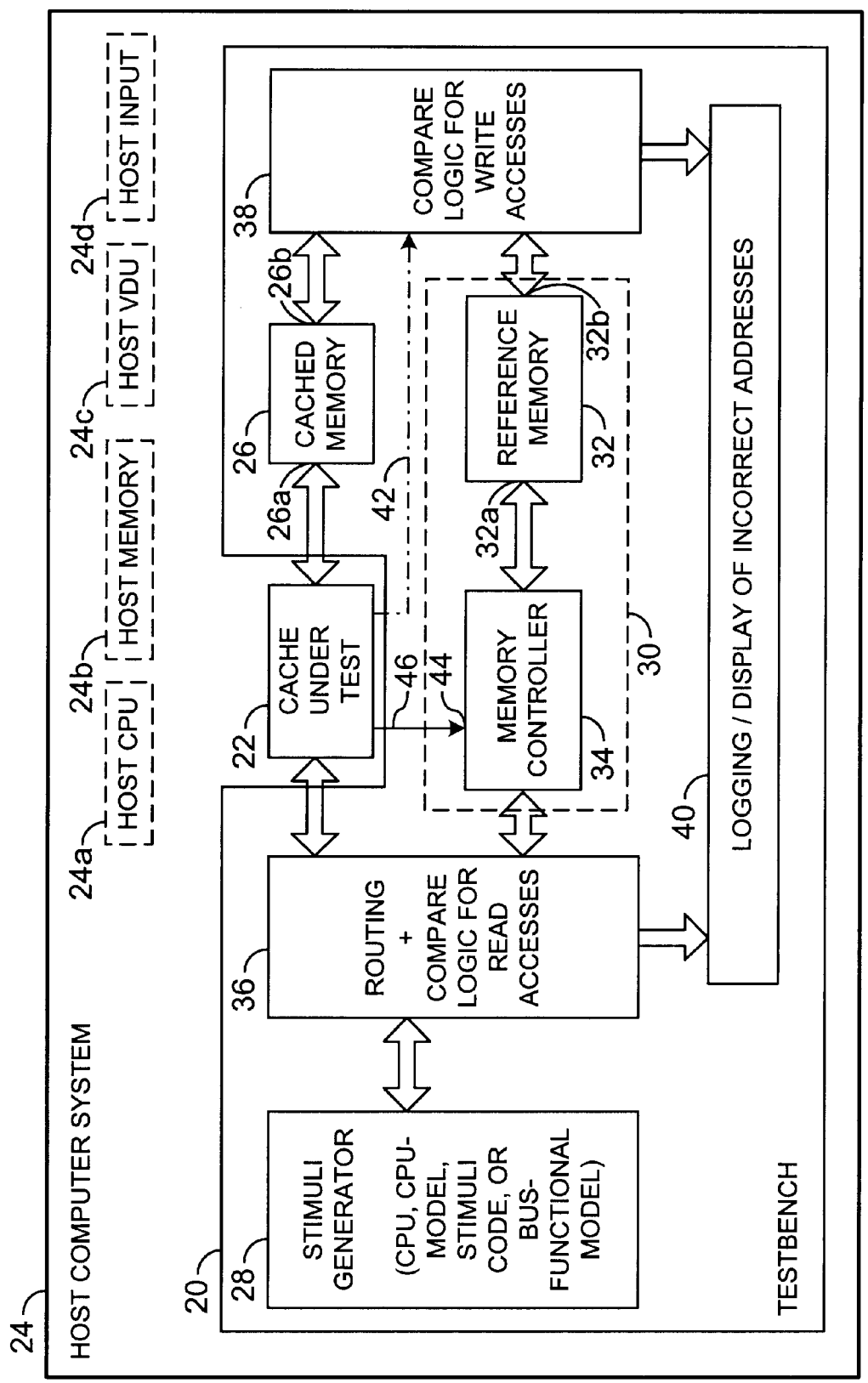
FIG. 3 is a schematic block diagram of a testbench apparatus in accordance with a first embodiment of the invention.

Referring to FIG. 3, a first embodiment of a testbench 20 for testing a cache model 22 is described. Although the embodiment illustrates the testing of a cache model 22, it will be appreciated that other memory related circuits may be tested using the same principles, for example, memory controllers, memory management units (MMU's), direct memory-access (DMA) controllers, and write-buffers. Unless otherwise specified, all of the "circuits" or units described in the testbench 20 are not hardware circuits, but are circuit models represented, for example, by HDL code (as explained previously).

The testbench 20 is implemented as a virtual environment in a host computer 24, which can include standard functional components such as: a main processor 24a; a storage device 24b containing the testbench model data and containing software for simulating operation and responses of the circuit models; a video output device 24c (such as a CRT or LCD display); and a manual input device 24d (such as a keyboard or a pointing device) for enabling the user to provide manual inputs to the computer.

A first port of the cache (model) 22 is coupled to a cached memory (model) 26 with which the cache 22 is intended to be used when the circuits are implemented in an integrated circuit. The testbench 20 also includes a stimuli generator 28, which may be in the form of hard-coded stimuli, a bus functional model, or a CPU model. The testbench further includes circuit (models) which interact with the cache 22, and which monitor the model performance at the same time (in the virtual environment) as the simulation of the. Thus an inventive technique used in this embodiment is to use dedicated monitor-circuitry models as part of the virtual testbench. The monitor circuitry compares the behaviour of the model under test (cache 22) with that of a reference model 30 which receives the same data as the model under test. The reference model 30 is coupled in parallel with the cache 22 and the cached memory 26. In this embodiment, the reference model 30 comprises a reference memory 32 and a memory controller 34. The reference memory is preferably of the same depth and width as the cached memory 26. The monitor circuitry may comprises a circuit 30, a circuit 36, a circuit 38 and/or a circuit 40.

A first routing and compare logic (model) 36 is coupled between the stimuli generator 28 and the parallel cache 22 and memory controller 34 for communicating signals from the stimuli generator 28 to both the cache 22 and the memory controller 34, and for comparing the data returned from the cache 22 and the memory controller during a "read access". The first routing and compare logic 36 is coupled to the cache via a second port. A second compare logic (model) 38 is coupled to the cached memory 26 and to the reference memory 32, for comparing the contents of the memory after a "write access" through the cache 22. In this embodiment, in order to allow the second compare logic 38 seamless access to the memories without interrupting data access through the cache 22 or through the memory controller 34, the cached memory 26 and the reference memory 32 each include an additional read port, in addition to the main read port (which in this embodiment is shown as a main input/output port). The main input/output port 26a of the cached memory 26 is coupled to the cache 22 to allow data reads and writes to the cache 22. The second (additional read) port 26b of the cached memory is coupled to the second compare logic 38 to allow independent read access to the second compare logic 38. Similarly, the main input/output port 32a of the reference memory 32 is coupled to the memory controller 34 to allow data reads and writes to the memory controller 34. The second (additional read) port 32b of the reference memory 32 is coupled to the second compare logic 38 to allow independent read access to the second compare logic 38. An error logging circuit 40 receives outputs from the first routing and compare logic 36 and from the second compare logic 38, for recording the occurrence of errors if the results of the comparisons do not match. This function, and the functions of the first and second compare logic 36 and 38, will be better understood from the following description of operation.

Initially, prior to the test commencing, the cached memory 26 and the reference memory 32 are loaded with predetermined data. This transfer operation can be performed through the first routing and compare logic 36 (with the cache function disabled). Alternatively, if the second ports 26b and 32b of the cached memory 26 and the reference memory 32 permit write access, then the initial data may be loaded through the second compare logic 38.

The stimuli generator 28 is then operated to simulate patterns of data accesses to test the operation of the cache 22. In general, such accesses fall into two categories: write accesses (e.g., data being written from the stimuli generator 28 to the cache); and read accesses (e.g., data being read back from or via the cache 22).

For each "write access", the first routing and compare logic 36 simply communicates the write access signals to both the cache 22 and the memory controller 34. In the reference model 30, the memory controller 34 provides a direct write of the data to the appropriate address in the reference memory 32, so that the data is stored directly in the reference memory. In contrast, in the test channel, depending on the design or programming of the cache 22, the data may either be written immediately by the cache 22 to the cached memory 26, or the data may be delayed in the cache 22, and written to the cached memory 26 at some later time.

If the cache 22 is of a type which writes data immediately to the cached memory 26, then (subject to a small time delay window), the data should be written into both the cached memory 26 and the reference memory 32 at about the same time. Therefore, in response to a write access, the second compare logic 38 accesses the last written-to location (which will be the same address for both memories), and compares the data read from each memory. If the data is identical, then the cache is functioning properly. If the data does not match, then the cache has performed a faulty operation, and an error condition is generated to the error logging circuit 40.

If the cache 22 is of a type which delays the writing of data to the cached memory 26, then it is necessary to delay the comparison operation of the second compare logic 38 until the data is finally written from the cache 22 to the cached memory 26. For example, the write operation from the cache 22 can be signalled by means of a control line 42 from the cache 22 to the second compare logic 38. When a write signal appears on the control line 42, this signals that a write has occurred to the cached memory 26, and triggers the second control logic 38 to perform a read and a comparison of the contents of the respective memory locations (as described previously). It will also be appreciated that the control signal on line 42 could be generated instead by the port 26a of the cached memory 26, or by the cached memory itself. It will also be appreciated that the same form of control line 42 may be used even if the cache is not of a delayed-write type, to synchronise the second compare logic 38 to the timing of the cache 22.

When an error is detected by the second compare logic 38, the circuit 40 may be "operable" either to log the error details (for example, the time of occurrence, the memory address, and the contents of the corresponding locations in the cached memory 26 and the reference memory 32). Additionally, or alternatively, the error logging circuit 40 may be operable to generate a display of the error condition to the developer. If desired, the circuit 40 can be programmed to halt the stimuli generator 28 when an error occurs so that the developer can investigate the error condition using known debugging tools. Alternatively, the circuit 40 may simply "log" the error, and allow the stimuli generator 26 to continue the simulation.

For each "read access" (e.g., data being read back from or via the cache 22), the first routing and compare logic 36 supplies the read request to both the cache 22 and the memory controller 34. In the reference model, the memory controller 34 does not contain any stored data, and so simply retrieves the data from the appropriate addressed location in the reference memory 36. In contrast, in the test channel, the operation of the cache 22 depends on whether a cache-hit occurs (e.g., whether the read access corresponds to data stored in the cache 22). If a cache-hit does occur, then the cache 22 supplies the data from its own internal memory; if a cache-hit does not occur, then the cache 22 performs a read operation to retrieve the data from the appropriate addressed location in the cached memory 26.

In general, the reference model 30 is designed to be faster than the model under test (in particular the cache 22, and to some extent the cached memory 26). This is easily achievable since the reference model 30 does not need to be a complete detailed model of an actual memory controller (34) and an actual reference memory (32). Instead, the reference model 30 need only include the bear minimum functionality for the purposes of providing a reference. Therefore, the reference model 30 generally never lags behind the cache channel, even if the a cache-hit enables the cache 22 to return data without having to access the cached memory 26.

Nevertheless, since the first routing and compare logic 36 performs a test in real time, it is important to ensure that the data "read" from the cache 22 is supplied to the first routing and compare logic 36 at the same time as the data "read" from the memory controller 34. To this end, the memory controller includes a wait-state control input 44 for holding the memory controller on a wait-state until a signal is received at the control input 44. The cache 22 generates an output on line 46 when it is ready (e.g., no longer busy), and this signal is supplied to the control input 44 to trigger the memory controller 34 to supply the data in synchronism with the cache 22. (In this embodiment, the control input 44 also provides a failsafe to ensure that the memory controller 34 does not lose synchronisation with the cache 22 during write accesses from the CPU. For example, problems may occur if two subsequent writes to the same address are processed at different times by the cache 22 and the memory controller 34.) It will also be appreciated that, if desired, the first routing and compare logic 36 could be provided with buffered interfaces to the cache 22 and the memory controller 34, so that it would accommodate data arriving from the cache 22 and from the memory controller 34 at different times. In the same manner as the second compare logic 38, the first compare logic 36 compares the data received from the cache 22 and from the memory controller 34. If the data is identical, then the cache 22 is functioning correctly. However, if the data does not match, then the cache 22 has performed an error, and an error condition is reported to the error logging circuit 40. In addition to the compare function, the first routing and compare logic 36 also feeds one set of the data (either from the cache 22 or from the memory controller 34) back to the stimuli generator 28. This data is normally that from the cache 22, and corresponds to the retrieved data resulting from the read access to the cache.

It will be appreciated that this embodiment provides near instantaneous, automatic verification of the functionality of the cache, without the developer having to manually analyse the results, and without the need for the stimuli generator 28 to include additional program overhead to monitor the signals returned from the cache 22 (e.g. if a CPU or CPU-model is used for the stimuli generator). If an error is detected, then the precise time of the error, and the relevant contents of the memories, can be recorded in the error logging circuit 40, without placing any additional processing burden on the stimuli generator 28.

Moreover, since the first and second compare logic 36 and 38 function to continuously monitor the data written to, and read back from, the respective memories, there is no need for the entire contents of the cached memory 26 to be unloaded after the test to be analysed manually. This saves considerable time by avoiding the need for a slow data transfer operation to unload the cached memory 26.

Also, since the monitor circuitry (elements 30–40) merely has to be a functional model (rather than a precise model of actual hardware elements), the monitor circuitry can be modelled with the minimum function necessary, and so this does not place significant burden on the host computer running the virtual testbench environment 20.

In the first embodiment, if an error is logged, then the developer still has, of course, the task of manually analysing the signals in the cache model to try to determine the reason for the error. In other words, this embodiment can identify automatically that an error has occurred, and can identify the external symptoms of the error, but it does not automatically identify the reason behind the error. This is because the reference model 30 does not provide for an accurate comparison of the internal signals within the cache 22, as the reference model 30 uses a simple memory controller 34 instead of a cache 22.

Figure 4:
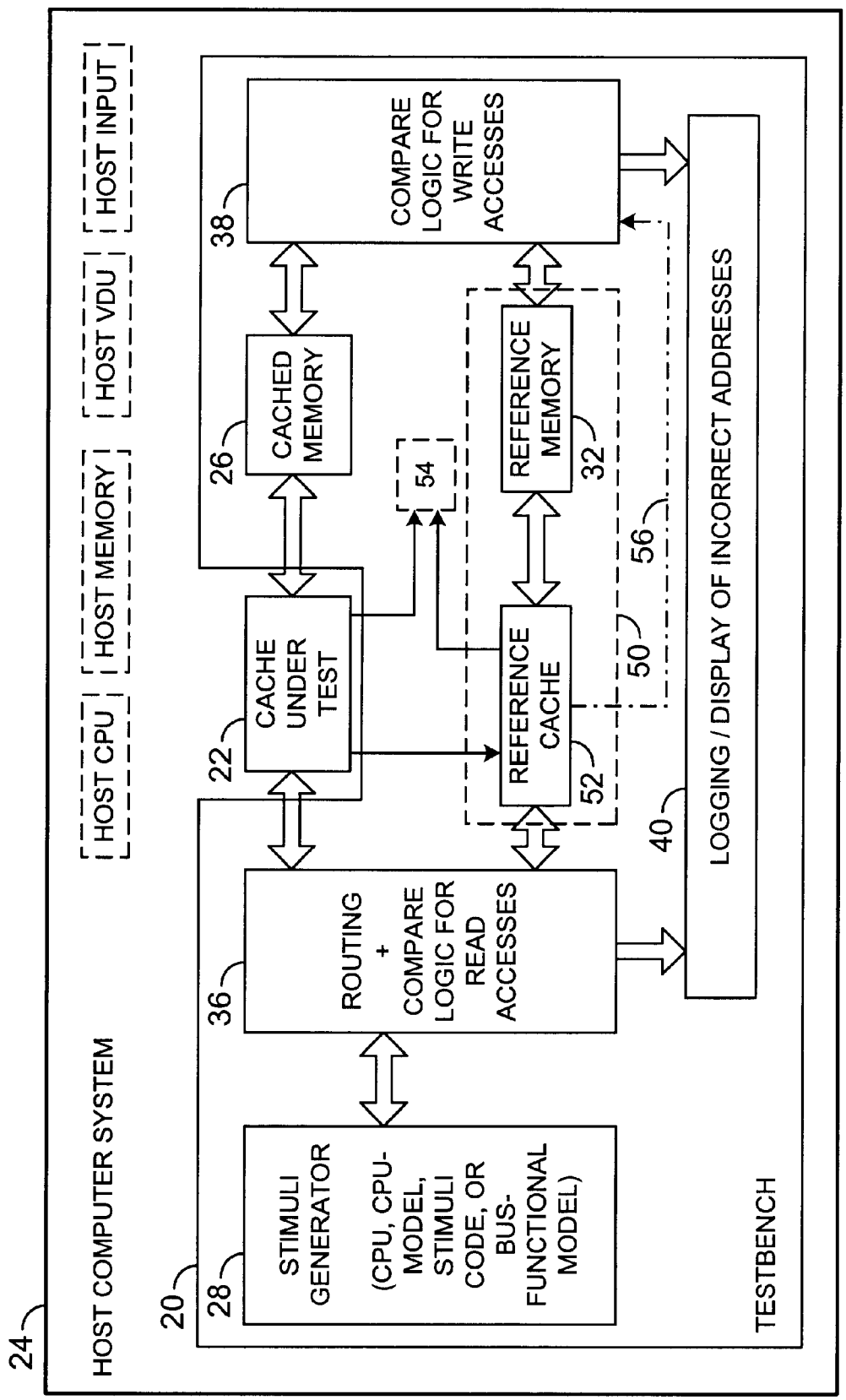
FIG. 4 is a schematic block diagram of a testbench apparatus in accordance with a second embodiment of the invention.

The task of analysing internal signals in the cache 22 can be simplified using the modified embodiment of FIG. 4, in which a different reference model 50 is employed. In particular, the memory controller 34 is replaced by a reference cache model 52, which is preferably an existing, verified cache of the same basic architecture as the cache 22 under test. The testbench 20 operates in the same manner as that described previously, by comparing the signals outputted from the reference model 50 and from the test channel, using the first and second compare logic 36 and 38. However, with this embodiment, should an error be detected, then it is possible to perform a direct comparison between the registers and signal states in the cache 22 under test and in the reference cache 52. Block 54 represents schematically a debugging tool (either manual or automatic) for reading and comparing the register and signals states for the two cache models, to assist the developer.

It will be appreciated that, in order for the reference cache 52 to provide a reference for the internal signals in the cache 22 under test, then the reference cache model 52 should contain the same level of detail as the cache 22 under test. Such increased detail may place some additional processing burden on the testbench host computer, but with the advantage of a better reference for comparison. In the embodiment of FIG. 4, since the reference cache 52 provides an accurate reference for the expected behaviour of the cache 22 under test, the signal line 42 (for signalling the second compare logic 38) may be replaced by a signal line 56 originating from the reference cache 52. In such case, the reference cache 52 would provide a control signal when a data write to the reference memory 32 occurs in the reference model 50. This timing would also be the expected timing of a data write from the cache 22 to the cached memory 26 in the test channel (if the reference cache 52 is a similar reference model). Therefore, the data in the cached memory 26 and in the reference memory 32 should be generally in synchronisation, and the second compare logic 38 can be triggered from either cache 22 or 52.

It will be appreciated that the second reference model 50 could, if desired, be added to the first embodiment as a third data channel in parallel with the first reference model 30 and the test channel. This would then provide a reference model against which the internal state of the cache 22 under test could be compared if an error was detected based on the input/output signals from the first reference model 30.

Figure 5:
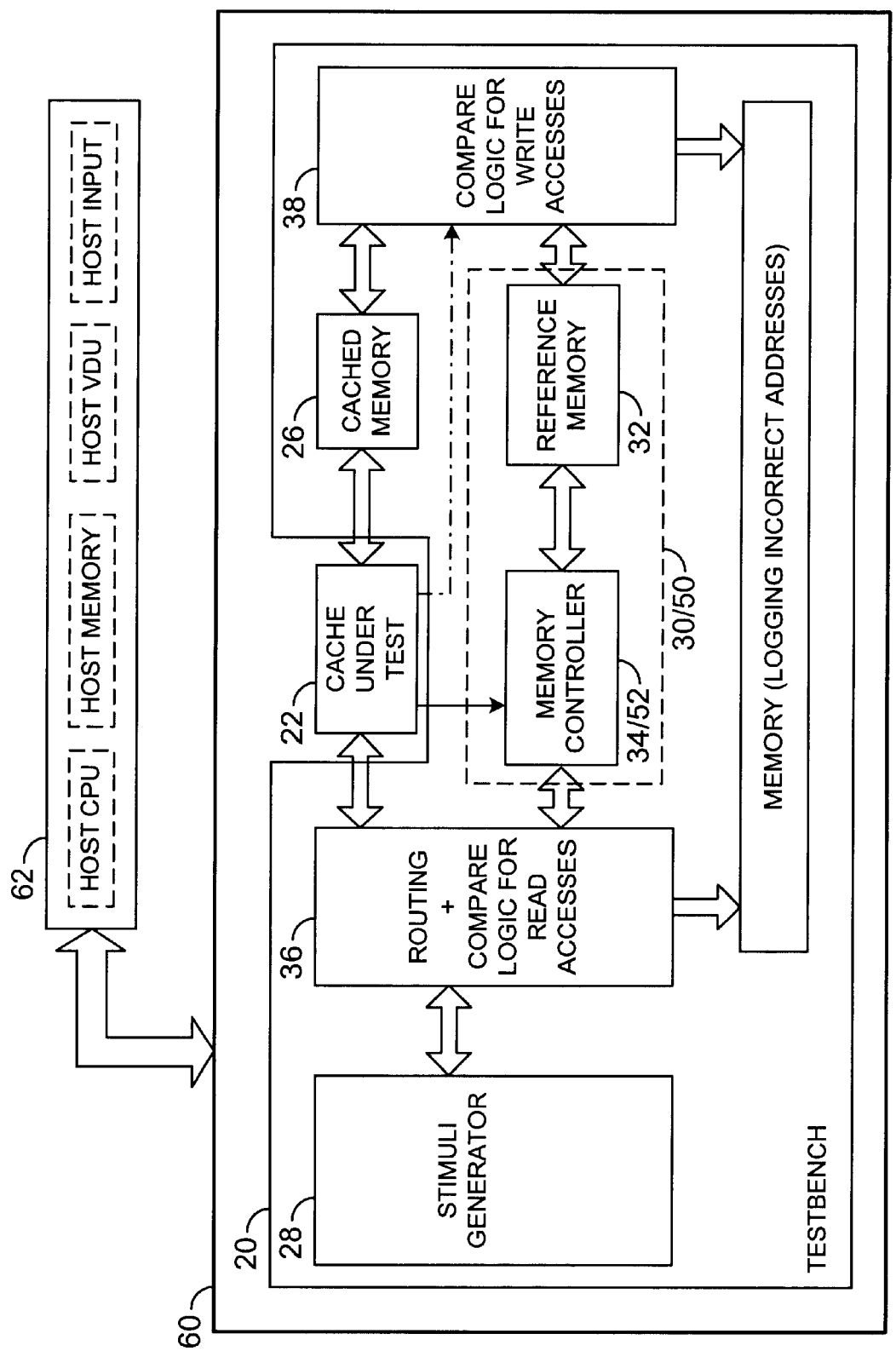
FIG. 5 is a schematic block diagram showing a further embodiment modelled in hardware.

In the foregoing embodiments, the testbench and the cache are represented as HDL data models, and the behaviour of the circuit is simulated in a virtual environment by a software simulator. A further embodiment is illustrated in FIG. 5 in which the testbench circuits 20 and the cache circuit 22 are both modelled in hardware in a programmable logic device (PLD) 60. A PLD is an integrated circuit including predefined circuit elements and logic blocks which can be coupled together in a user-programmable (or user re-programmable) manner to build up a complete circuit. The logic blocks may, for example, include comparators, processor, gates and even whole memories. PLDS include, by way of example, complex programmable logic devices (CPLD's) and field programmable gate arrays (FPGA's). Either the stimuli generator 28 can be implemented in the PLD, or a separate external CPU or other hardware signal generator may be used to simulate a CPU or a hardware CPU-model.

In this embodiment, the circuit design is implemented and tested in hardware in the PLD 60, which may provide advantages in terms of speed. A hardware verification may be expected to be several orders of magnitude faster than a verification using a software simulator processing HDL model data. The error logging could, for example, be handled by a memory 40 as part of the PLD, which is subsequently read or sent to a host computer system 62. In addition, real-time timing issues may be tracked and investigated more comprehensively.

It will also be appreciated that the same principles as those described in the various embodiments above can be used to test other memory related circuits, such as memory controllers, memory management units (MMU's), direct memory-access (DMA) controllers, and write-buffers. The invention, particularly as illustrated in the preferred embodiments, can provide an extremely powerful tool for functional verification of a design of a memory related circuit prior to fabrication of the circuit in hardware. In particular, the use in a testbench model of dedicated monitoring circuitry and a parallel reference which processes the same simulated data as the circuit under test, can provide automatic, real-time verification without placing any additional overhead on a stimuli generator. It will be appreciated that the foregoing description is merely illustrative of preferred examples of the invention. Also the skilled man will readily understand that many modifications, equivalents and improvements may be used within the scope and principles of the invention, and the appended claims are intended to be interpreted broadly to include all such modifications, equivalents and improvements.

What is claimed is:

1. An apparatus for testing a functional operation of a memory related circuit, said memory related circuit being represented by a first circuit model defining a circuit under test, the apparatus comprising:

a storage device for storing said first circuit model representing said circuit under test, and for storing a second circuit model representing a testbench circuit for interfacing with said circuit under test;

a processor for processing said first and second circuit models to simulate a response of said circuit under test when simulated signals are applied thereto via said testbench circuit, said simulated signals simulating read and write accesses to said circuit under test;

wherein said second circuit model representing the testbench circuit includes:

a first memory for interfacing with a first port of said circuit under test; and monitor circuitry for interfacing with at least one of said memory and a second port of said circuit under test, for monitoring the response of said circuit under test as said simulated signals are applied thereto.

2. The apparatus according to claim 1, wherein said monitor circuitry comprises:

a reference circuit comprising at least a second memory; and compare logic for comparing simulated data from said reference circuit with simulated data from said circuit under test.

3. The apparatus according to claim 2, wherein said compare logic is coupled to said first memory and to said second memory for comparing simulated data in said first memory with simulated data in said second memory;

wherein said compare logic indicates an error condition if a result of said comparison is not equal.

4. The apparatus according to claim 3, wherein:

said first memory includes first and second output ports, said first output port interfacing with said first port of said circuit under test, and said second output port coupled to said compare logic, said second output port permitting data to be read out to said compare logic independently of said first output port; and said second memory includes a third output port and a fourth output port, said fourth output port being coupled to said compare logic, said fourth output port permitting data to be read out to said compare logic independently of said third output port.

5. The apparatus according to claim 3, where said comparison is performed following a simulated write access to said circuit under test.

6. The apparatus according to claim 2, wherein said compare logic is coupled to said circuit under test and to said reference circuit for comparing simulated data returned from said circuit under test with simulated data returned from said reference circuit;

wherein said compare logic indicates an error condition if a result of said comparison is not equal.

7. The apparatus according to claim 6, wherein said comparison is performed following a simulated read access to said circuit under test.

8. The apparatus according to claim 2, wherein said compare logic comprises:

first compare logic for comparing, in response to a read access, simulated data returned from said circuit under test with simulated data returned from said reference circuit; and second compare logic for comparing, in response to a data write access, simulated data in said first memory with simulated data in said second memory;

wherein an error condition is indicated if a result of either comparison is not equal.

9. The apparatus according to claim 2, wherein said reference circuit further includes a memory controller coupled to said second memory.

10. The apparatus according to claim 2, wherein said reference circuit further includes a reference cache coupled to said second memory.

11. The apparatus according to claim 1, wherein said second circuit model data includes a stimuli generator for simulating said signals to be applied to said circuit under test.

12. An apparatus for testing a functional operation of a memory related circuit, said memory related circuit being represented by a first circuit model defining a circuit under test, the apparatus comprising:

a programmable logic device for implementing a circuit including said first circuit model and a testbench circuit for interfacing with said circuit under test; and a stimulator coupled to said programmable logic device for applying signals thereto to simulate signals being applied to said circuit under test via said testbench circuit, said simulated signals simulating read and write accesses to said circuit under test;

wherein said testbench circuit includes:

a first memory for interfacing with a first port of said circuit under test; and monitor circuitry for interfacing with at least one of said memory and a second port of said circuit under test, for monitoring the response of said circuit under test as said simulated signals are applied thereto.

13. The apparatus according to claim 12, wherein said monitor circuitry comprises:

a reference circuit comprising at least a second memory; and compare logic for comparing data from said reference circuit with data from said circuit under test.

14. The apparatus according to claim 13, wherein said compare logic is coupled to said first memory and to said second memory for comparing data in said first memory with data in said second memory;

wherein said compare logic indicates an error condition if a result of said comparison is not equal.

15. The apparatus according to claim 14, wherein:

said first memory includes first and second output ports, said first output port interfacing with said first port of said circuit under test, and said second output port coupled to said compare logic, said second output port permitting data to be read out to said compare logic independently of said first output port; and said second memory includes a third output port and a fourth output port, said fourth output port being coupled to said compare logic, said fourth output port permitting data to be read out to said compare logic independently of said third output port.

16. A method for testing a functional operation of a design for a memory related circuit to be incorporated in an integrated circuit, the method comprising the steps of:

(A) providing first data representing a model of said memory related circuit as a circuit under test, said circuit under test including a first port and a second port;

(B) providing second data representing a model of a testbench circuit for testing said circuit under test, said testbench circuit including a first memory for interfacing with said first port of said circuit under test and monitor circuitry for interfacing with at least one of said memory and said second port of said circuit under test, for monitoring a response of said circuit under test as simulated signals are applied thereto; and (C) processing said first and second data to simulate said response of said circuit under test when simulated signals applied thereto via said testbench circuit, said simulated signals simulating read and write accesses to said circuit under test.

17. A method for testing a functional operation of a design for a memory related circuit to be incorporated in an integrated circuit, the method comprising the steps of:

(A) programming a programmable logic device with a circuit including:

a first model of said memory related circuit as a circuit under test, said circuit under test including a first port and a second port; and a testbench circuit for testing said circuit under test, said testbench circuit including a first memory for interfacing with said first port of said circuit under test and monitor circuitry for interfacing with at least one of said memory and said second port of said circuit under test, for monitoring a response of said circuit under test as simulated signals are applied thereto; and (B) applying signals to said programmable logic device to simulate signals being applied to said circuit under test via said testbench circuit, said simulated signals simulating read and write accesses to said circuit under test.

18. A circuit comprising:

means for storing a first model representing a circuit under test comprising (i) a first port and (ii) a second port;

means for storing a second model representing a testbench circuit comprising (i) a memory for interfacing with said first port and (ii) a monitor circuit for interfacing with at least one of said memory and said second port to monitor a response of said circuit under test as simulated signals are applied thereto; and means for processing said first model and said second model to simulate said response of said circuit under test when said simulated signals are applied thereto via said testbench circuit, said simulated signals simulating read and write accesses to said circuit under test.

* * * * *